US006802903B2

(12) United States Patent
Barber et al.

(10) Patent No.: US 6,802,903 B2
(45) Date of Patent: Oct. 12, 2004

(54) APPARATUS FOR APPLYING ADHESIVE TO TUBING

(75) Inventors: Brian Barber, Southlake, TX (US); John Young, Staten Island, NY (US)

(73) Assignee: Becton, Dickinson and Company, Franklin Lakes, NJ (US)

( * ) Notice: Subject to any disclaimer, the term of this patent is extended or adjusted under 35 U.S.C. 154(b) by 82 days.

(21) Appl. No.: 10/608,859

(22) Filed: Jun. 27, 2003

(65) Prior Publication Data

US 2004/0050322 A1 Mar. 18, 2004

Related U.S. Application Data

(62) Division of application No. 10/228,673, filed on Aug. 27, 2002, now abandoned.

(60) Provisional application No. 60/324,813, filed on Sep. 25, 2001.

(51) Int. Cl.[7] .............................................. C23C 14/00

(52) U.S. Cl. ........... 118/50; 118/DIG. 11; 118/DIG. 13; 118/104; 118/121; 118/203; 118/209; 118/216; 118/220; 118/221; 118/226; 118/255; 118/411; 118/419; 118/423; 118/428; 118/503; 118/600

(58) Field of Search .................. 118/DIG. 11, DIG. 13, 118/50, 104, 121, 203, 209, 216, 220, 221, 226, 255, 411, 419, 423, 428, 503, 600

(56) References Cited

U.S. PATENT DOCUMENTS 3,972,304 A 8/1976 Boucher ...................... 118/44
3,982,980 A 9/1976 van Manen ................ 153/73.5
4,276,333 A 6/1981 Cobean ........................ 428/36
4,413,585 A 11/1983 Weinhold et al. ............. 118/61
5,151,306 A 9/1992 Andrews et al. ......... 427/434.5
5,183,669 A 2/1993 Guillemette ................ 425/113
5,186,279 A 2/1993 Chasteen et al. .......... 184/15.1
5,217,533 A 6/1993 Hay et al. ...................... 118/63
5,292,068 A 3/1994 Raterman et al. ............. 239/11
5,368,644 A 11/1994 Delgado ..................... 118/405
5,407,132 A 4/1995 Messerly et al. ........... 239/124
5,492,583 A 2/1996 Fingerson et al. .......... 156/180
5,540,773 A 7/1996 Chesterfield et al. ......... 118/67
5,614,265 A 3/1997 Chaudhry et al. .......... 427/430
5,728,429 A 3/1998 Berrenberg et al. ......... 427/345
5,786,036 A 7/1998 Pannenbecker et al. ..... 427/444
5,882,409 A 3/1999 Stahl .......................... 118/712

FOREIGN PATENT DOCUMENTS

EP 0490000 A1 12/1990

*Primary Examiner*—Bernard Pianalto
(74) *Attorney, Agent, or Firm*—Scott J. Rittman, Esq.

(57) ABSTRACT

An apparatus and method are provided for applying adhesive to an outer circumference of a section of tubing. The apparatus includes opposed grippers with concave adhesive transfer areas that can be moved into surrounding relationship with the tubing. Adhesive dispensing passages communicate with the adhesive transfer areas for delivering adhesive to the tubing. Counterbores are at opposed ends of the adhesive transfer areas and communicate with a vacuum source for removing excess adhesive.

9 Claims, 6 Drawing Sheets

APPARATUS FOR APPLYING ADHESIVE TO TUBING

This application is a DIV of Ser. No. 10/228,673 filed Aug. 27, 2002 and now ABN claims priority of U.S. Provisional Patent Application No. 60/324,813 filed Sep. 25, 2001.

BACKGROUND OF THE INVENTION

1. Field of the Invention

The invention relates to medical tubing, and more particularly relates to an apparatus and method for applying adhesive to a section of the outer surface of a length of tubing.

2. Background of the Invention

Many medical procedures employ a length of flexible plastic tubing for delivering fluid to a patient or for withdrawing bodily fluids from a patient. Opposed ends of the tubing typically are placed permanently in communication with plastic fittings. The typical plastic fitting includes opposed proximal and distal ends and a passage extending between the ends. Portions of the passage adjacent the proximal end of the fitting are dimensioned to receive an end of the flexible plastic tubing. The distal end of the plastic fitting may be configured for placement directly in communication with a patient or for placement in communication with another fitting.

The connection between the end of the plastic tubing and the proximal end of the plastic fitting must prevent separation of the tubing from the fitting in response to pulling forces and also must achieve a fluid-tight hermetic seal. An adhesive typically has been employed for this one longitudinal side of the plastic tubing adjacent the end of the tubing. The end of the plastic tubing then is telescoped into the plastic fitting. The telescoping movement of the tubing is intended to urge the drop of adhesive completely into the annular space between the tubing and the fitting. This prior art procedure tends to cause some of the adhesive to be pushed into a bead on the tubing and externally of the proximal end of the plastic fitting. A sufficient accumulation of adhesive adjacent the proximal end of the fitting can affect the ability of external latches or shields on the fitting to perform properly. Additionally, it is difficult to assure that the adhesive has wicked properly into all areas between the plastic tubing and the fitting. Accordingly, it is difficult to ensure that a good hermetic seal has been achieved. A uniform distribution of the adhesive is difficult to achieve when the adhesive has a high viscosity. Hence, a low viscosity highly flowable adhesive typically is used for these purposes. This limits the selection of adhesives.

There also are disclosed attempts to secure plastic tubing to a fitting by first assembling the tubing to the fitting and then inserting adhesive into the annular space between the tubing and the fitting. The adhesive has been inserted, for example, with a small gauge needle and a low viscosity adhesive. This prior art approach again limits the types of adhesives that can be employed. Furthermore, this design is complicated and it is difficult to ensure that adhesive will flow uniformly into the annular space between a plastic tubing and the fitting.

SUMMARY OF THE INVENTION

The subject invention is directed to an apparatus and method for applying a thin coat of adhesive uniformly to an outer circumferential surface region of a section of plastic tubing. adjacent an end of the tubing. The apparatus comprises a pair of grippers that are selectively movable toward and away from one another. Each gripper may be formed from a metallic plate material with opposite front and rear faces and a tube-mating face extending between the front and rear faces. The front and rear faces of each gripper are spaced apart a thickness that is equal to or greater than the length of the tubing to which the adhesive is to be applied.

The tube-mating face of each gripper includes a concave adhesive transfer area located centrally between and substantially transverse to the front and rear faces. The concave shape of the adhesive transfer area in each gripper conforms to the external shape of the tubing and forms a common longitudinal axis with the grippers. Most tubing is substantially cylindrical, and hence the tube transfer areas define a concave semi-cylindrical surfaces. The dimensions of the adhesive transfer areas of the grippers are selected to enable the adhesive transfer areas to nest completely around the tubing without occluding the tubing.

The tube-mating face of each gripper further is characterized by front and rear counterbores extending into the respective front and rear faces of the gripper and symmetrically disposed around opposite ends of the adhesive transfer area. The counterbores, however, define a larger cross-sectional area than the adhesive transfer area.

The tube-mating face of each gripper further is characterized by a vacuum channel spaced from the adhesive transfer area and extending between the front and rear counterbores. The channels in the grippers are disposed to substantially register with one another when the grippers move toward one another.

Each gripper further includes an adhesive dispensing passage for delivery of adhesive to the adhesive transfer area of the gripper.

At least one gripper further includes a vacuum passage extending into communication with the vacuum channel and configured for communication with a vacuum source. Thus, the vacuum passage enables a low pressure to be applied to the channel and to the counterbores with which the vacuum channel communicates.

The apparatus is employed by delivering a controlled amount of adhesive through the respective adhesive dispensing passages and into the adhesive transfer areas. The flow of adhesive into the adhesive transfer areas may commence before the tubing is positioned between the grippers. The end of the tubing then is disposed between the grippers, and the grippers are moved to engage around opposite sides of the tubing. Thus, the tubing is engaged in the adhesive transfer areas, but without a tight gripping that could occlude the tubing. The adhesive preferably has already commenced flowing into the adhesive transfer areas when the grippers are closed around the tubing so that adhesive in the adhesive transfer areas is urged continuously and circumferentially around the section of the tubing to which the adhesive is to be applied. A vacuum is applied at the vacuum passage typically as the grippers are being closed around the tubing. The vacuum draws excess adhesive into the counterbores. The adhesive then flows from the counterbores through the channel and through the vacuum passage for collection and/or recirculation. The vacuum contributes to a uniform thin coating of adhesive around the outer circumferential surface of the tubing and further contributes to removal of excess adhesive from areas where an adhesive build-up could affect performance of the medical device to which the tubing is connected. Additionally, the adhesive removal steps may be carried out simultaneously with the adhesive application steps, and as a result additional cleaning steps are not required for removing excess adhesive.

There is a definite need in the art of adhesive application for improvements which can overcome problems which arise with prior art apparatus. The present invention is directed to overcoming these problems and fulfilling this need.

DETAILED DESCRIPTION OF THE INVENTION

Figure 1:
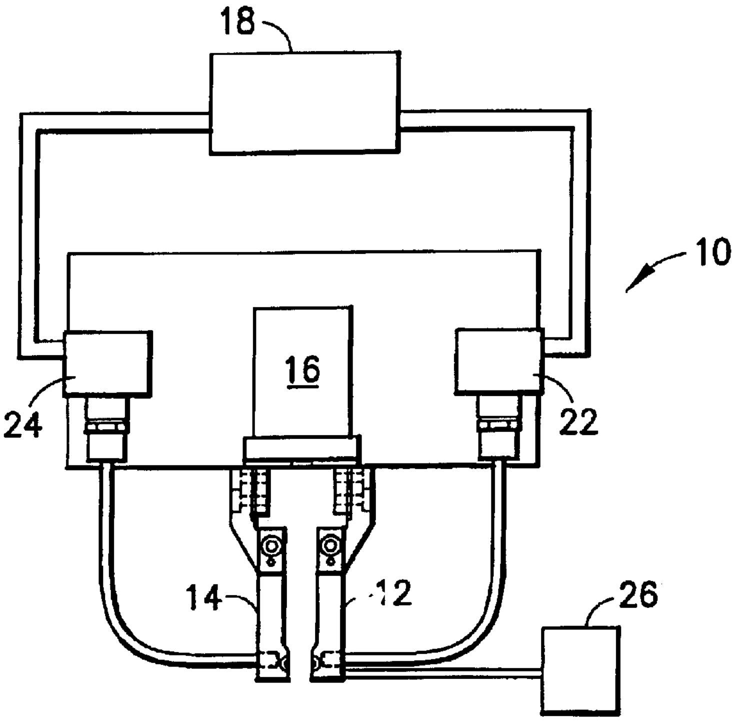
FIG. 1 is a schematic view of an adhesive applicator apparatus of the subject invention in a load position that permits loading of a section of tubing into the apparatus.

An apparatus for applying adhesive to an outer circumferential surface of a short section of plastic tubing is identified generally by the numeral 10 in FIG. 1. Apparatus 10 includes first and second grippers 12 and 14 respectively. Grippers 12 and 14 are mounted to a pneumatic actuator cylinder assembly 16 which is operative for moving grippers 12 and 14 from a load position shown in FIG. 1 to a dispense position described and illustrated below. Grippers 12 and 14 are spaced from one another in the load position shown in FIG. 1, but move toward one another in the dispense position.

Apparatus 10 further includes an adhesive supply 18 that communicates with first and second valves 22 and 24 respectively. First and second valves 22 and 24 communicate respectively with first and second grippers 12 and 14 and are operative for selectively directing adhesive from adhesive supply 18 to first and second grippers 12 and 14.

Apparatus 10 further includes a vacuum source 26 that communicates with first gripper 12.

Figure 2:
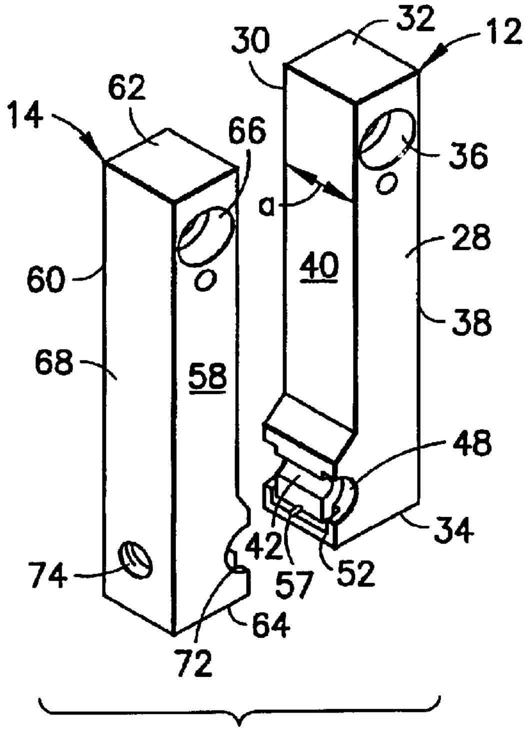
FIG. 2 is a perspective view of the grippers of the apparatus shown in FIG. 1.

First gripper 12 is machined from a stainless steel material and includes opposite substantially parallel planar front and rear faces 28 and 30. Front and rear faces 28 and 30 arc spaced from one another by a distance "a", as shown in FIG. 2, that equals or slightly exceeds the length of tubing to which adhesive is to be applied. First gripper 12 is an elongate structure with an upper mounting end 32 and a lower tube engaging end 34. Mounting end 32 is characterized by a mounting aperture 36 for mounting first gripper 12 to pneumatic actuating cylinder assembly 16. First gripper 12 also is characterized by an adhesive supply face 38 and an opposed tube mating face 40 each of which extends between the front and rear faces 28 and 30.

Figure 3:
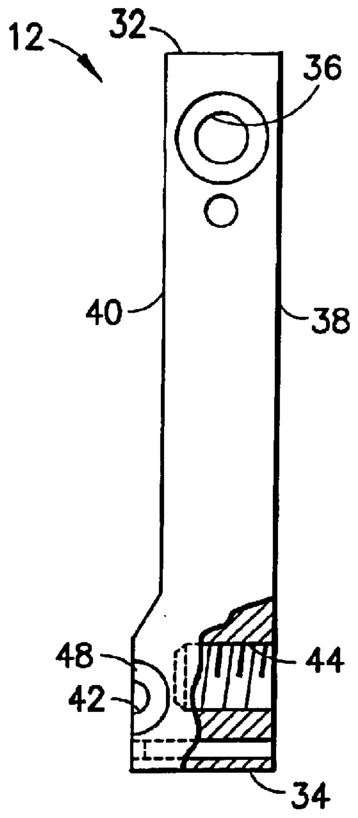
FIG. 3 is a front elevational view, partly in section, of the first gripper.
Figure 4:
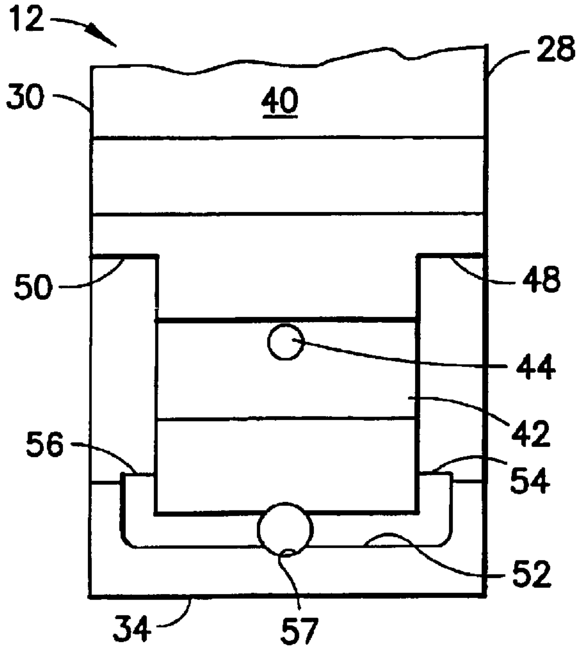
FIG. 4 is an elevational view of the tubing mating face of the first gripper.
Figure 5:
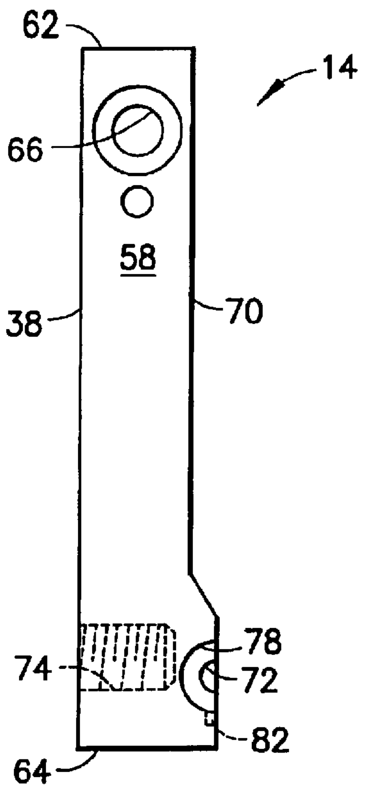
FIG. 5 is a front elevational view of the second gripper of the apparatus.

Tube mating face 40 is characterized by a generally semi-cylindrical concave adhesive transfer area 42 generated about an axis aligned substantially perpendicular to front and rear faces 28 and 30 of first gripper 12. Adhesive transfer area 42 defines a diameter equal to or slightly greater than the outside diameter of the length of tubing to which adhesive will be applied. An adhesive supply passage 44 extends through first gripper 12 from adhesive supply face 38 to adhesive transfer area 42, as shown in FIG. 3. More particularly, adhesive supply passage 44 intersects adhesive transfer area 42 at a location 46 disposed centrally between front and rear faces 28 and 30 and at an above-center position on a side of the axis of adhesive transfer area 42 further from lower end 34 of first gripper 12, as shown in FIGS. 3 and 4.

Front and rear counterbores 48 and 50 extend into front and rear faces 28 and 30 of first gripper 12. Front and rear counterbores 48 and 50 are cross-sectionally larger than adhesive transfer area 42 and are substantially symmetrically disposed around opposite ends of adhesive transfer area 42.

A generally U-shaped vacuum channel 52 is formed into tube mating face 40 of first gripper 12 at a location between lower end 34 of first gripper 12 and adhesive transfer area 42. More particularly, vacuum channel 52 has a front end 54 communicating with front counterbore 48 and a rear end 56 communicating with rear counterbore 50. A vacuum passage 57 extends through first gripper 12 from adhesive supply face 38 to a location in vacuum channel 52 approximately centrally between front and rear ends 54 and 56 of vacuum channel 52.

Figure 6:
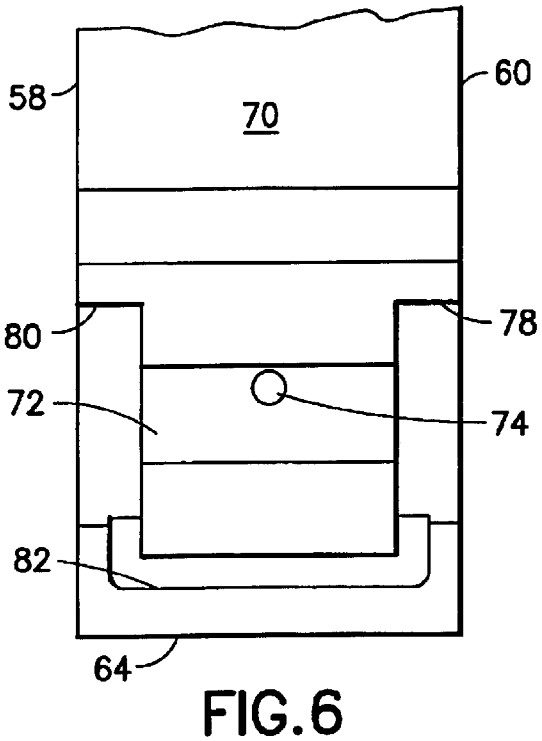
FIG. 6 is an elevational view of the mating face of the second gripper.

Second gripper 14 is structurally similar to first gripper 12. More particularly, second gripper 14 also is machined from a stainless steel material and has substantially parallel planar front and rear faces 58 and 60. Front and rear faces 58 and 60 are spaced from one another by a distance "a" substantially equal to the thickness of first gripper 12. Second gripper 14 further includes an upper mounting end 62 and a lower tube engaging end 64 substantially as with first gripper 12. A mounting aperture 66 extends through second gripper 14 to mount second gripper 14 securely on pneumatic actuating cylinder 16. Second gripper 14 further includes an adhesive supply face 68 and a tube mating face 70. A concave semi-cylindrical adhesive transfer area 72 is formed in tube mating face 70 at a location to register with adhesive transfer area 42 of first gripper 12 when grippers 12 and 14 are moved from the load position shown in FIG. 1 to the dispense position around a section of tubing. Second gripper 14 further includes an adhesive supply passage 74 that extends from adhesive supply face 68 to adhesive transfer area 72. The intersection of adhesive supply passage 44 with adhesive transfer area 42 is at an above center position as shown in FIG. 6 and as described with respect to first gripper 12.

Front and rear counterbores 78 and 80 extend into front and rear faces 68 and 70 of second gripper 14 at locations symmetrically surrounding opposite ends of adhesive transfer area 72. A U-shaped vacuum channel 82 is formed in tube mating face 70 at locations spaced from adhesive transfer area 72. Vacuum channel 82 is disposed to register with vacuum channel 52 when first and second grippers 12 and 14 are moved into the dispense position described further below. In the illustrated embodiment, second gripper 14 is not provided with a vacuum passage comparable to vacuum passage 57 formed in first gripper 12.

Figure 7:
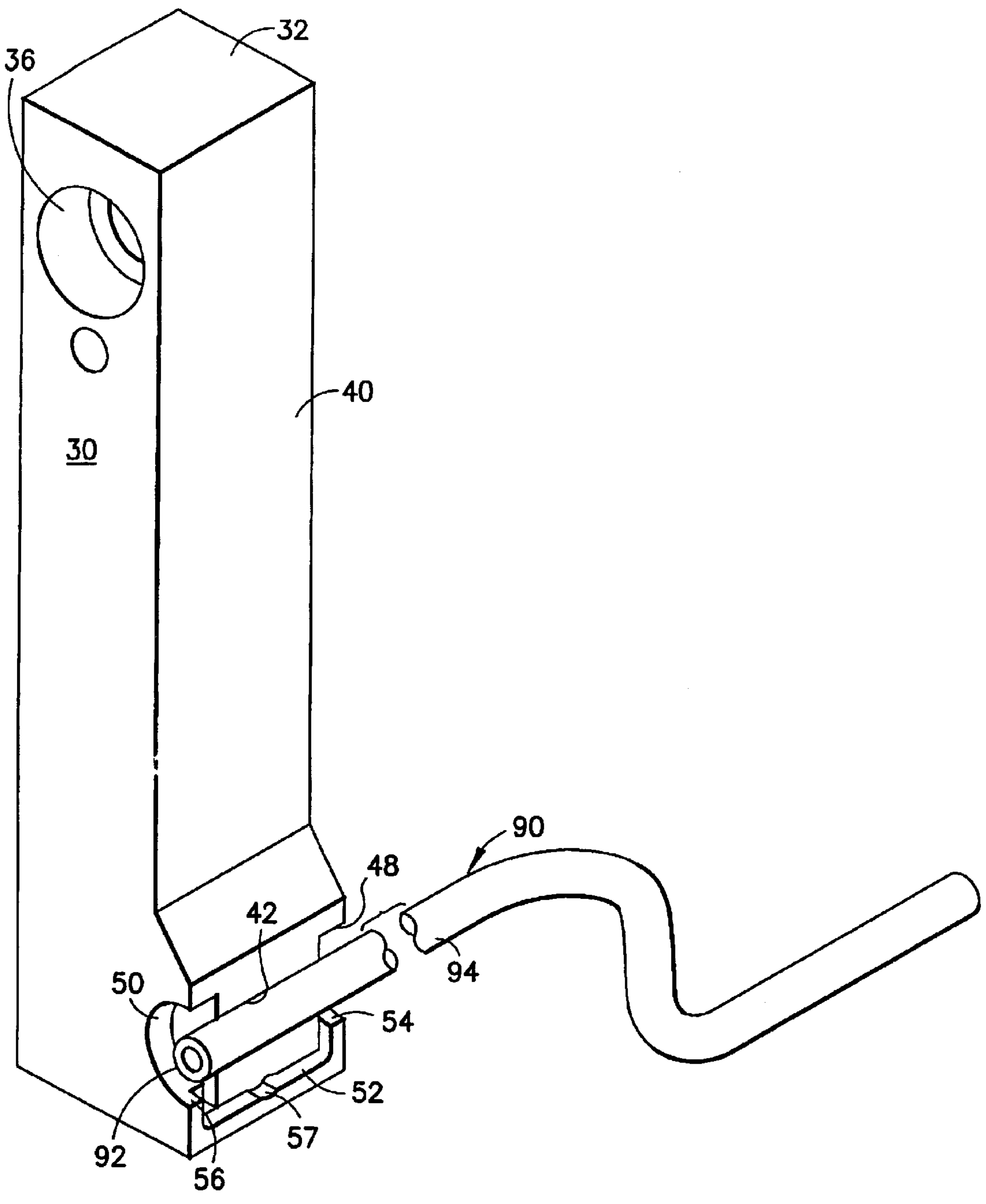
FIG. 7 is a perspective view of the first gripper with a section of tubing loaded therein.
Figure 8:
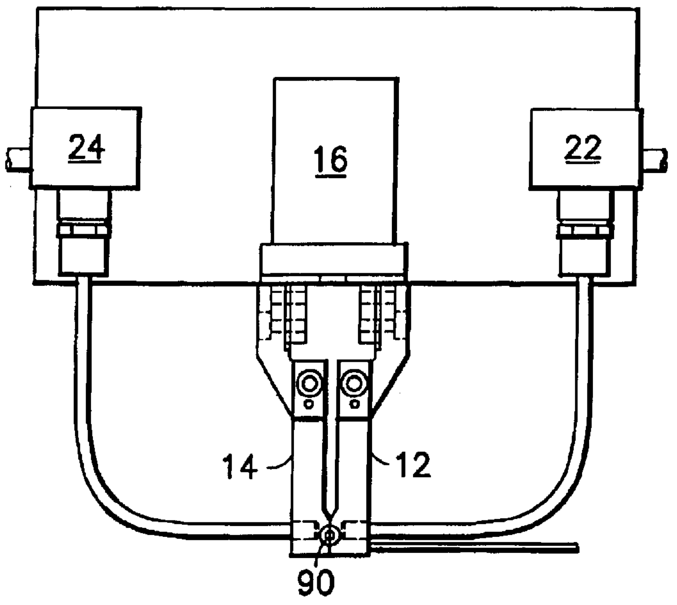
FIG. 8 is a schematic view similar to FIG. 1, but showing the grippers engaged around the section on of tubing.
Figure 9:
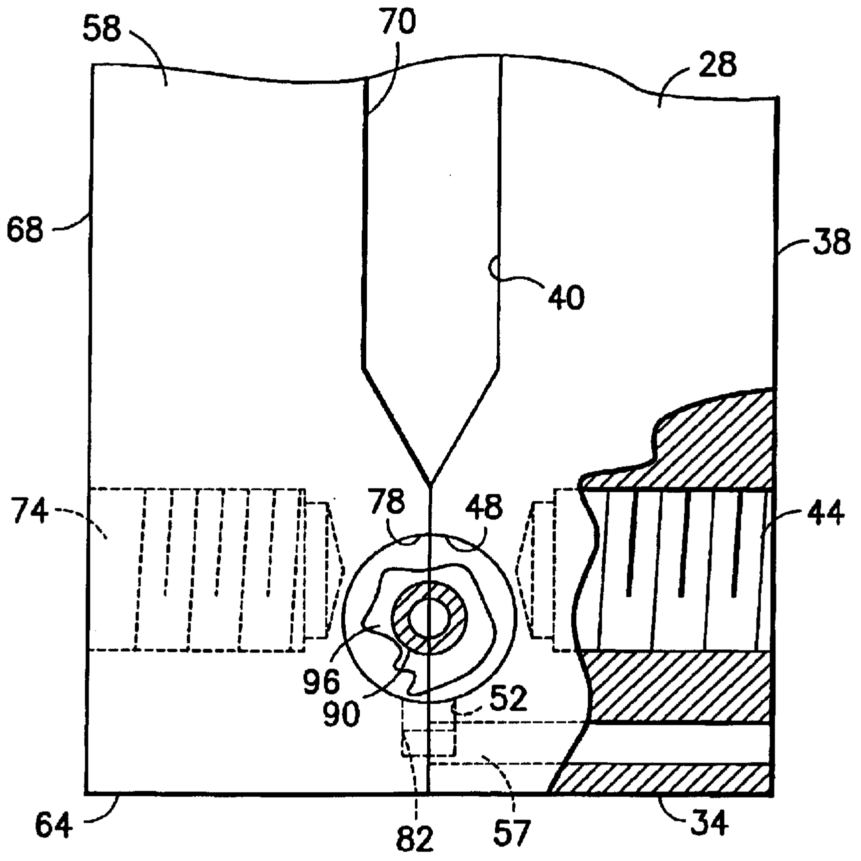
FIG. 9 is an enlarged view of portions of the grippers engaged with the tubing.

Apparatus 10 is used with a length of PVC tubing 90 as shown in FIG. 7. Tubing 90 has an end 92 and an outer circumferential surface 94 extending entirely along the length of tubing 90. Portions of outer circumferential surface 94 in proximity to end 92 are to be hermetically sealed and fixedly secured in a plastic fitting intended for medical applications. Adhesive is applied to outer circumferential surface 94 of tubing 90 adjacent end 92 by loading end 92 of tubing 90 into the space between adhesive transfer areas 42 and 72 of first and second grippers 12 and 14. A flow of adhesive material then is initiated by actuating first and second valves 22 and 24 respectively to permit adhesive to flow from first and second valves 22 and 24 into adhesive passages 44 and 74, and hence into adhesive transfer areas 42 and 72. First and second grippers 12 and 14 are moved under the action of pneumatic actuating cylinder assembly 16 toward one another and into surrounding relationship with tubing 90, as shown in FIGS. 8 and 9. At this point, adhesive 96 has entered upper regions adhesive transfer areas 42 and 72 and flows slightly downward due to gravitational forces. Movement of grippers into the dispense position of FIGS. 8 and 9 upon adhesive 96 against outer circumferential surface regions 94 of tubing 90 adjacent end 92. The relative cross-sectional dimensions of adhesive transfer areas 42 and 72 help to achieve a smooth uniform distribution of adhesive 96 circumferentially around outer surface 94 of tubing 90 adjacent end 92.

Figure 10:
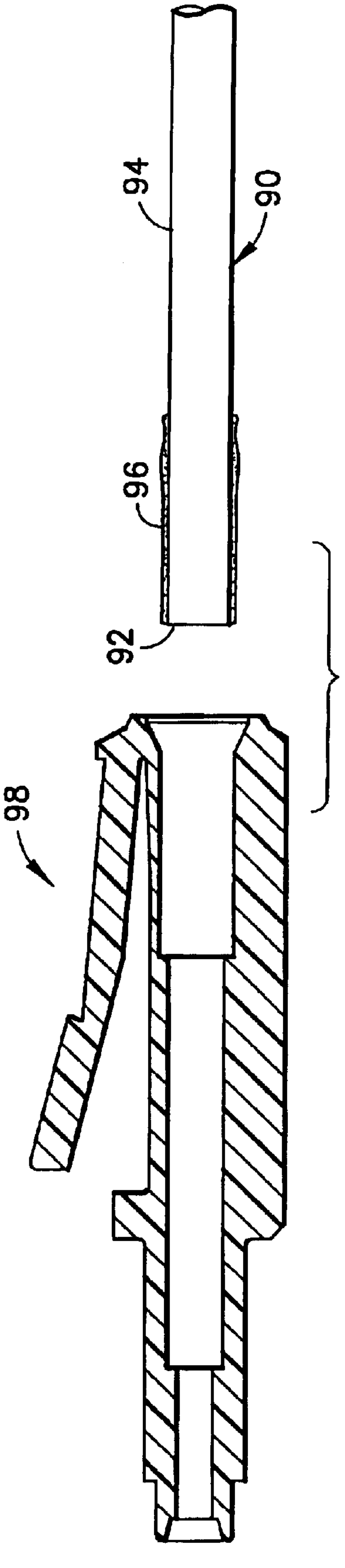
FIG. 10 is an exploded cross-sectional view showing the tubing with the adhesive applied hereto and in proximity to a plastic fitting.
Figure 11:
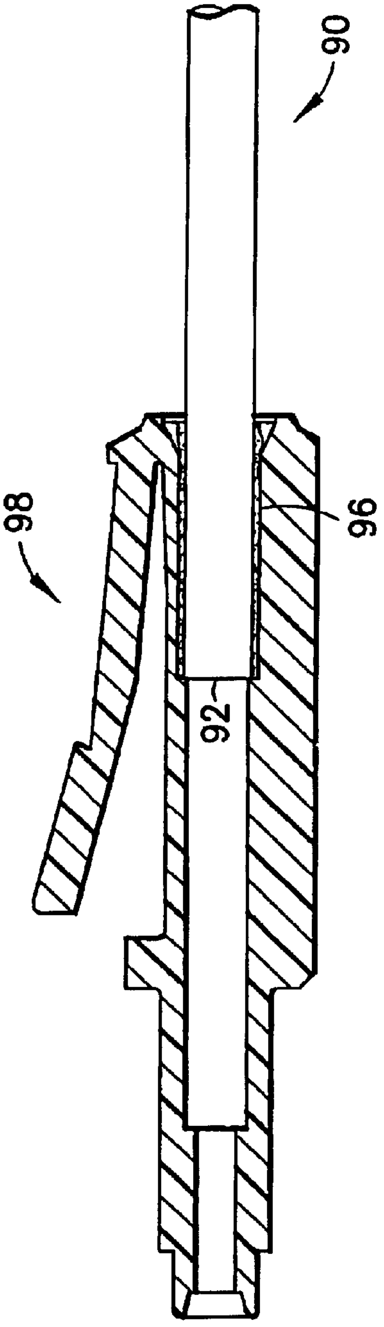
FIG. 11 is a cross-sectional view of the tubing fully mounted in the fitting.

Substantially simultaneously with movement of grippers 12 and 14 into the dispense position of FIGS. 8 and 9, vacuum source 26 is activated to create a low pressure that communicates with vacuum passage 57 and registered vacuum channels 52 and 82. Channels 52 and 82 communicate with registered front counterbores 48 and 78 and registered rear counterbores 50 and 80. Hence, adhesive 96 is drawn toward the counterbores by the low pressure to ensure the continuous circumferential coating of adhesive around outer surface 94 of tubing 92. Excess adhesive 96 then is drawn away from counterbores 48, 50, 78 and 80, through registered vacuum channels 52 and 82 and through vacuum passage 57 in first gripper 12. Actuating cylinder assembly 16 then is actuated again to move grippers 12 and 14 from the FIG. 8 condition into the FIG. 1 position. Tubing 90 is removed from apparatus 10 and has a thin uniform coating of adhesive 96 as shown in FIG. 10. End 92 of tubing 90 may be inserted into fitting 98 as shown in FIG. 11, and may be subjected to UV radiation for curing. As illustrated schematically in FIG. 11, substantially no excess adhesive exists either at the opening of fitting 98 or at end 92 of tubing 90. Hence, fluid flow through tubing 90 is not impeded and latches or other safety structures on fitting 98 are not affected by excess adhesive 96.

What is claimed is:

1. An apparatus for applying adhesive to an outer circumferential surface of a section of tubing comprising:

a) first and second grippers having tube-mating faces, said faces each being formed with a concave adhesive transfer area dimensioned and disposed for surrounding said outer circumferential surface of said tubing;

b) first and second adhesive supply passages extending through said first and second grippers and into communication with said adhesive transfer areas for delivering said adhesive to said adhesive transfer areas;

c) counterbores at opposite respective ends of said adhesive transfer areas, and;

d) a vacuum apparatus communicating with said counterbores for removing excess adhesive.

2. The apparatus of claim 1, wherein each of said first and second grippers has opposite front and rear faces, said adhesive transfer areas being aligned substantially transverse to said front and rear faces of said respective grippers, said counterbores comprising a front counterbore extending into said front face of each said gripper and a rear counterbore extending into said rear face of each said gripper, said front and rear counterbores being cross-sectionally larger than said adhesive transfer area and being substantially symmetrical about said adhesive transfer area.

3. The apparatus of claim 2, wherein each said adhesive transfer area is substantially semi-cylindrically generated.

4. The apparatus of claim 3, wherein said adhesive supply passages communicate with said adhesive transfer areas at locations substantially centrally between said front and rear faces of said grippers.

5. The apparatus of claim 3, wherein said vacuum apparatus comprises first and second vacuum channels formed in said tube-mating faces of said grippers at locations for substantial registration with one another and at locations spaced from said tube transfer areas, said channels communicating with said front and rear counterbores, said vacuum apparatus further comprising a vacuum passage extending from said vacuum channels to a vacuum source.

6. The apparatus of claim 5, wherein the vacuum passage is formed in said first gripper.

7. The apparatus of claim 1, wherein each said gripper has an upper end engageable with means for moving said grippers toward and away from one another, each said gripper further having a lower end, said adhesive transfer areas defining a common longitudinal axis when said grippers are moved toward one another, said adhesive passages being disposed between said common axis of said adhesive transfer areas and said upper ends of said grippers, said vacuum apparatus communicating with locations on said grippers between said common axis and said lower end of said grippers.

8. The apparatus of claim 1, further comprising means for selectively moving said first and second grippers toward and away from one another, means for directing said adhesive to said respective first and second adhesive passages before moving said first and second grippers toward one another and means for operating said vacuum apparatus after said first and second grippers move toward one another.

9. An apparatus for applying adhesive to an outer circumferential surface of a section of substantially cylindrical tubing, said apparatus comprising first and second grippers, each said gripper having an upper end mountable to means for moving said grippers toward and away from one another and an opposite lower end, each said gripper further having a tube mounting face in proximity to said lower end, each said tube mounting face being formed with a substantially horizontal concave semi-cylindrical adhesive transfer area extending therethrough, front and rear counterbores being formed in each said tube mounting face at opposite respective ends of each said adhesive transfer area, said adhesive transfer area, said front counterbore and said rear counterbore in said first gripper being disposed to register respectively with said adhesive transfer area, said front counterbore and said rear counterbore of said second gripper, first and second adhesive passages formed respectively in said first and second grippers for delivering adhesive to upper portions of said adhesive transfer areas, a vacuum channel formed in at least one of said tube mounting faces and communicating with said front and rear counterbores, and a vacuum source communicating with said vacuum channel for removing excess adhesive from said counterbores.

* * * * *